United States Patent
Patra et al.

(10) Patent No.: US 9,823,577 B2
(45) Date of Patent: Nov. 21, 2017

(54) FACET MIRROR FOR A PROJECTION EXPOSURE APPARATUS

(71) Applicant: Carl Zeiss SMT GmbH, Oberkochen (DE)

(72) Inventors: Michael Patra, Oberkochen (DE); Markus Deguenther, Aalen (DE)

(73) Assignee: Carl Zeiss SMT GmbH, Oberkochenl (DE)

( * ) Notice: Subject to any disclaimer, the term of this patent is extended or adjusted under 35 U.S.C. 154(b) by 3 days.

(21) Appl. No.: 15/050,889

(22) Filed: Feb. 23, 2016

(65) Prior Publication Data
US 2016/0170308 A1    Jun. 16, 2016

Related U.S. Application Data

(63) Continuation of application No. PCT/EP2014/069997, filed on Sep. 19, 2014.

(30) Foreign Application Priority Data

Sep. 23, 2013   (DE) .................. 10 2013 219 057

(51) Int. Cl.
    *G03B 27/54*    (2006.01)
    *G03F 7/20*     (2006.01)
    (Continued)

(52) U.S. Cl.
    CPC ........... *G03F 7/702* (2013.01); *G02B 5/0891* (2013.01); *G02B 5/09* (2013.01); *G02B 26/0833* (2013.01);
    (Continued)

(58) Field of Classification Search
    CPC ... G03F 7/702; G03F 7/70191; G03F 7/70058
    (Continued)

(56) References Cited

U.S. PATENT DOCUMENTS 7,859,647 B2 * 12/2010 Bleeker ............... G03F 7/70291
                                                        355/53
2004/0130561 A1    7/2004 Jain
(Continued)

FOREIGN PATENT DOCUMENTS

DE      10148167      4/2003
DE      10345430      6/2005
(Continued)

OTHER PUBLICATIONS

German Office Action, with translation thereof, for corresponding DE Appl No. 10 2013 219 057.3, dated Jul. 23, 2014.
(Continued)

*Primary Examiner* — Hung Henry Nguyen
(74) *Attorney, Agent, or Firm* — Fish & Richardson P.C.

(57) ABSTRACT

A facet mirror, such as for use as an optical component in a projection exposure apparatus for EUV microlithography, includes at least two mirror modules having individual mirrors and mirror module surfaces and at least on one side a non-reflective edge region and a module edge. Adjacent individual mirrors in the mirror modules are a distance from each other that is less than half the width of the non-reflective edge region. The at least two adjacent module edges of adjacent mirror modules are offset with respect to each other by a height h along the surface normal of one of the two mirror module surfaces.

22 Claims, 9 Drawing Sheets

(51) Int. Cl.
  *G02B 26/08* (2006.01)
  *G02B 5/08* (2006.01)
  *G02B 5/09* (2006.01)

(52) U.S. Cl.
  CPC ...... *G03F 7/70075* (2013.01); *G03F 7/70116* (2013.01)

(58) Field of Classification Search
  USPC ........................................ 355/52, 55, 67–71
  See application file for complete search history.

(56) References Cited

U.S. PATENT DOCUMENTS

| | | | |
|---|---|---|---|
| 2005/0286112 A1* | 12/2005 | Patel | G02B 26/0841 359/291 |
| 2006/0132747 A1 | 6/2006 | Singer et al. | |
| 2009/0324170 A1 | 12/2009 | Cheung et al. | |
| 2011/0063598 A1 | 3/2011 | Fiolka et al. | |
| 2012/0287414 A1 | 11/2012 | Fiolka et al. | |
| 2014/0218708 A1* | 8/2014 | Werber | G03F 7/70058 355/67 |
| 2015/0062549 A1 | 3/2015 | Patra et al. | |

FOREIGN PATENT DOCUMENTS

| | | |
|---|---|---|
| DE | 102009032194 A1 | 4/2010 |
| DE | 102012203716 A1 | 9/2013 |
| DE | 102012207866 | 11/2013 |
| JP | 2011-228536 | 11/2011 |
| WO | WO 2009/132756 A1 | 11/2009 |
| WO | WO 2012/130768 A2 | 10/2012 |

OTHER PUBLICATIONS

The International Search Report and a Written Opinion from the corresponding PCT Application No. PCT/EP2014/069997, dated Jan. 14, 2015.

Taiwanese Office Action, with translation thereof, for corresponding TW Application No. 103132654, dated Apr. 26, 2016.

* cited by examiner

PRIOR ART

PRIOR ART

FACET MIRROR FOR A PROJECTION EXPOSURE APPARATUS

CROSS-REFERENCE TO RELATED APPLICATION

The present application is a continuation of, and claims benefit under 35 USC 120 to, international application PCT/EP2014/069997, filed Sep. 19, 2014, which claims benefit under 35 USC 119 of German Application No. 10 2013 219 057.3, filed Sep. 23, 2013. The entire disclosure of international application PCT/EP2014/069997 and German Application No. 10 2013 219 057.3 are incorporated by reference herein.

FIELD

The disclosure relates to a facet mirror, such as for use as an optical component in a projection exposure apparatus for EUV microlithography.

BACKGROUND

Facet mirrors are known from WO 2012/130768 A2. These facet mirrors are mirror arrays. These facet mirrors include a multiplicity of mirror elements in which the totality of the mirror elements forms a parqueting of a total reflection surface of the mirror array, and wherein the mirror array is embodied modularly as a tile element in such a way that the parqueting of the total reflection surface can be represented by a tiling of a plurality of such mirror arrays.

One problem of such facet mirrors is posed by a possibly non-reflective edge region of the mirror arrays. Such a non-reflective edge region may be desirable on account of the production method, on account of the electrical or other driving of the mirror arrays, or serve for the mechanical stability of the mirror array. Such a non-reflective edge region leads to shadings of the incident—"upstream"—and/or of the reflected—"downstream"—light. These shadings either result in a loss of light or an effective reduction of the reflectivity, which is undesirable particularly in the case of EUV lithography systems and arises from the fact that part of the incident light impinges on the non-reflective edge region and is therefore not reflected, or result in an enlargement of the volume of the envelope of the light-filled phase space, which can in turn have adverse effects on the uniformity of the field illumination and/or the homogeneity of the pupil filling. This volume enlargement arises as a result of the fact that the non-reflective edge regions have the effect that behind the mirror array—downstream—there are regions which are unilluminated on account of the shadings. These unilluminated regions can result in unilluminated pupil regions, whereby the pupil filling is adversely influenced, or the reticle field is not illuminated uniformly on account of the shadings.

Furthermore, WO 2009/132756 A1 discloses facet mirrors including macroscopic field facets which consist of one piece and which are combined with correction facets for correcting the uniformity of the field illumination. In this case, the correction facets, in accordance with one embodiment, can lie in the shading region of another facet mirror. In contrast to WO 2009/132756 A1, the shading region is avoided or greatly minimized in a targeted manner in the case of the present disclosure.

Furthermore, US 2009/0324170 A1 discloses stepped mirrors for reducing the coherence. The steps of such stepped mirrors introduce different phase shifts, whereby the coherence of the incident light is reduced.

SUMMARY

The disclosure seeks to provide a facet mirror such that the shadings mentioned are at least partly reduced.

In one aspect, the disclosure provides a facet mirror for use as an optical component in a projection exposure apparatus for EUV microlithography. The facet mirror includes at least three mirror modules. The mirror modules include a multiplicity of individual mirrors. The mirror modules have mirror module surfaces. The mirror modules have at least on one side a non-reflective edge region having a module edge. Adjacent individual mirrors in the mirror modules are a distance from one another which is less than half the width of the non-reflective edge region. At least two adjacent module edges of adjacent mirror modules are offset with respect to one another by a height h along the surface normal of one of the two mirror module surfaces. For the height hit holds true that: h<100 mm. At least three mirror modules arranged alongside one another are offset with respect to one another in a staircase-like fashion.

According to the disclosure, it has been recognized that a targeted height-offset arrangement of the abovementioned mirror arrays can be used for reducing the shading regions.

According to the disclosure, this object is achieved via a facet mirror for use as an optical component in a projection exposure apparatus for EUV microlithography, wherein the facet mirror includes at least three mirror modules. The mirror modules include a multiplicity of individual mirrors, wherein the mirror modules have mirror module surfaces. The mirror modules have at least on one side a non-reflective edge region having a module edge. Adjacent individual mirrors within the mirror modules are at a distance from one another that is less than half the width of the non-reflective edge region, wherein at least adjacent module edges of adjacent mirror modules are arranged in a manner offset with respect to one another by a height h along the surface normal of one of the two mirror module surfaces. In accordance with one embodiment, for the height h it holds true in this case that: h<100 mm. In accordance with one embodiment, the at least three mirror modules arranged alongside one another are arranged in a manner offset with respect to one another in a staircase-like fashion. In a staircase-like fashion means here that the modules arranged alongside one another are arranged either in an ascending manner or in a descending manner alongside one another, with the result that they form a staircase structure. In accordance with one embodiment, at least six mirror modules arranged alongside one another are arranged in a manner offset with respect to one another in a staircase-like fashion.

In accordance with one embodiment, at least half of the modules are arranged in an offset manner. In accordance with one embodiment, at least 70% of the modules are arranged in a manner offset with respect to one another in a staircase-like fashion.

In accordance with one embodiment, the facet mirror is configured in such a way that during operation the edge region of a mirror module is situated in the shading region of the light incident on the facet mirror or of the light reflected from the facet mirror. The shading regions are minimized as a result.

In accordance with one embodiment, the facet mirror has an edge region having the width d at least on one side. The at least two adjacent module edges of the adjacent mirror modules are arranged in a manner offset with respect to one another by a height h along the surface normal of the first mirror module surface. The facet mirror is designed for a light incidence angle $\alpha$, wherein $0°<\alpha<90°$ holds true. The light incidence angle $\alpha$ is the angle between the surface normal of the mirror module surface of one of the mirror modules and a component of the incident light, the component being projected into a plane that is perpendicular to one of the adjacent module edges arranged in a height-offset manner with respect to one another.

It holds true that: $0.5*d/\tan(\alpha)<h<1.5*d/\tan(\alpha)$. If the height $h<d/\tan(\alpha)$ is chosen, then the shading region is enlarged in comparison with the theoretically optimum solution. If the height $h>d/\tan(\alpha)$ is chosen, then the shading region is enlarged and the shading also extends to the reflective part of the mirror module surface of the adjacent mirror module, which results in undesirable loss of light. Therefore, it is advantageous according to the disclosure if the height h lies in the interval $0.5*d/\tan(\alpha)<h<1.5*d/\tan(\alpha)$.

In accordance with one embodiment, for the height it holds true that $h>0.01$ mm, in particular $h>0.1$ mm. In the case of an excessively small height of $h<0.01$ mm, for example, the effect of the minimization of the shading by the non-reflective edge regions is too small. In accordance with one embodiment, for the height h it holds true that: $0.1$ mm$<h<100$ mm, in particular 1 mm$<h<10$ mm, in particular 1 mm$<h<1$ mm. In the case of an excessively large height of $h>100$ mm, for example, the shading extends not only to the non-reflective edge region but also to the mirror module surface of the adjacent mirror module, which results in undesirable loss of light. Moreover, in the case of an excessively large height h, the cumulated total height of the arrangement of the mirror modules becomes too high. The height that is actually to be chosen depends, however, on the width d of the non-reflective edge region and the light incidence angle $\alpha$.

The mirror modules include at least 2×2 individual mirrors arranged on a grid, wherein, by way of example, there can also be 10×10, 20×50, 100×100 or 1000×1000 individual mirrors on a mirror module. The individual mirrors have size in the range of 0.01 mm-10 mm, wherein the sizes can be, for example, 0.01 mm, 0.05 mm, 0.1 mm, 0.2 mm, 0.5 mm, 1 mm, 5 mm or 10 mm. Such mirror arrays including such small mirrors are also designated as micromirror arrays or as MEMS mirror modules ("micro-electro-mechanical systems"). The non-reflective edge region at least on one side can have a width d in the range of 0.01 mm-50 mm, for example 0.01 mm, 0.05 mm, 0.1 mm, 1 mm, 10 mm, 20 mm. The height h can be for example in the range of 0.01 mm-50 mm or can be $h>0.01$ mm, $>0.1$ mm, $>1$ mm or $>10$ mm or can lie in the interval $0.5*d/\tan(\alpha)<h<1.5*d/\tan(\alpha)$. In the case of an excessively small height of $h<0.01$ mm, for example, the effect of the minimization of the shading by the non-reflective edge regions is too small. In the case of an excessively large height of $h>100$ mm, for example, the shading extends not only to the non-reflective edge region but also to the mirror module surface of the adjacent mirror module, which results in undesirable loss of light. The height that is actually to be chosen depends, however, on the width d of the non-reflective edge region and the light incidence angle $\alpha$.

In accordance with one embodiment, in the case of the facet mirror the ratio of the widths of the upstream and downstream shading regions is in a range of between 1:10 and 1:2 or between 2:1 and 10:1. This width of the shading region can be, for example, the width of the shading region perpendicular to the light propagation direction.

In accordance with one embodiment of the facet mirror, the mirror modules are arranged in a descending manner, that is to say in the negative z-direction, in the direction of the incident light. The positive z-direction in each case faces away from the mirror module surface. Such an arrangement reduces the upstream shading region, which results in an increase in the effective reflectivity.

In accordance with one embodiment of the facet mirror, the mirror modules are arranged in an ascending manner, that is to say in the positive z-direction, in the direction of the incident light. Such an arrangement reduces the downstream shading region. Such a reduction of these shading regions has the advantageous effect that the uniformity of the illumination of the reticle field is improved. In addition, the phase space behind the facet mirror is "perforated" to a lesser extent by the shading regions, that is to say that the loss of phase space behind the facet mirror is minimal. This has the effect that, for example, the pupil filling is optimized, which in turn improves the adjustability of illumination settings.

In accordance with one embodiment of the facet mirror, the mirror modules are arranged in a manner offset with respect to one another in a staircase-like fashion in the direction of the diagonals of the mirror modules. In accordance with one embodiment of the facet mirror, the mirror modules are arranged in an ascending manner, that is to say in the positive z-direction in the direction of the incident light, or in a descending manner, that is to say in the negative z-direction in the direction of the incident light, in the direction of a diagonal of the mirror modules. This minimizes the shading regions downstream or upstream for the non-reflective edge regions along the module edges which are oriented along x and also along y. In this case, the diagonal runs in the plane spanned by the module edges of a module in such a way that the angles between the module edges and the diagonal for example in the case of a mirror module having a square outer shape are in each case a 45° angle. The relevant one of the two possible diagonals is that which in terms of absolute value has the greater projection of the direction of the incident light on itself.

In accordance with one embodiment of the facet mirror, the mirror module surfaces of the mirror modules are oriented parallel to one another.

In accordance with one embodiment, the mirror modules include micromirror arrays, which are also designated as MEMS mirror modules ("micro-electro-mechanical systems").

In accordance with one embodiment of the facet mirror, the mirror modules are arranged on a curved surface. This surface can be convexly or concavely curved. In accordance with one embodiment, the mirror modules are arranged on a spherical surface or an ellipsoidal surface. In this case, either the mirror module surface can be oriented in such a way as to result in the best possible correspondence with the curved surface, or the mid-points of the modules can lie on the desired surface.

In accordance with one embodiment of the facet mirror, the individual mirrors of the mirror modules are tiltable.

In accordance with one embodiment, the non-reflective edge region is not oriented parallel to the surface normal of the mirror module surface, but rather, for example for production reasons, is beveled toward the module edge 121, 221, 321, 421, 521.

In accordance with one embodiment, the non-reflective edge region is oriented parallel to the surface normal of the mirror module surface, wherein the non-reflective edge region, for example for production reasons, is height-offset with respect to the mirror module surface.

The disclosure additionally encompasses an illumination system including a facet mirror according to the disclosure.

In particular, the facet mirror can be a field facet mirror. A field facet mirror consists of field facets and is arranged in a manner optically conjugate with respect to the object plane.

In accordance with one embodiment of the illumination system, the facet mirror according to the disclosure is configured in such a way that the height h is chosen in such a way that the downstream shading regions, which can lead to shadings in the illumination of the object plane, are minimized, with the result that the illumination of the reticle field is as homogeneous as possible.

In accordance with one embodiment of the illumination system, the facet mirror according to the disclosure is a pupil facet mirror. A pupil facet mirror consists of pupil facets and is arranged either in the entrance pupil plane of the projection optical unit or in an optically conjugate plane with respect thereto.

In accordance with one embodiment of the illumination system, the mirror modules of the at least one facet mirror are micromirror arrays, which are also designated as MEMS mirror modules ("micro-electro-mechanical systems").

In accordance with one embodiment, the illumination system includes a fly's eye condenser including a field facet mirror and a pupil facet mirror, wherein the field facet mirror and/or the pupil facet mirror include(s) a facet mirror according to the disclosure.

In accordance with one embodiment, the illumination system includes a specular reflector, wherein the facet mirror according to the disclosure is a facet mirror for illuminating the specular reflector.

In accordance with one embodiment, the illumination system is configured in such a way that the etendue is maximized and/or the phase space in the light propagation direction behind the facet mirror is distinct in a continuous fashion. The phase space volume results from the product of the size of an object field and the square of the numerical aperture of the projection optical unit. The etendue is the volume of the phase space in which the intensity is not equal to zero. On account of the shading regions, regions of the phase space are not illuminated, thus giving rise to adverse effects on the uniformity of the field illumination and/or the homogeneity of the pupil filling.

In accordance with one embodiment, the illumination system is configured in such a way as to minimize the loss of light on account of the non-reflective edge regions.

The disclosure is explained in greater detail below on the basis of the exemplary embodiments illustrated in the accompanying drawings.

DETAILED DESCRIPTION OF THE PREFERRED EMBODIMENTS

Figure 8:
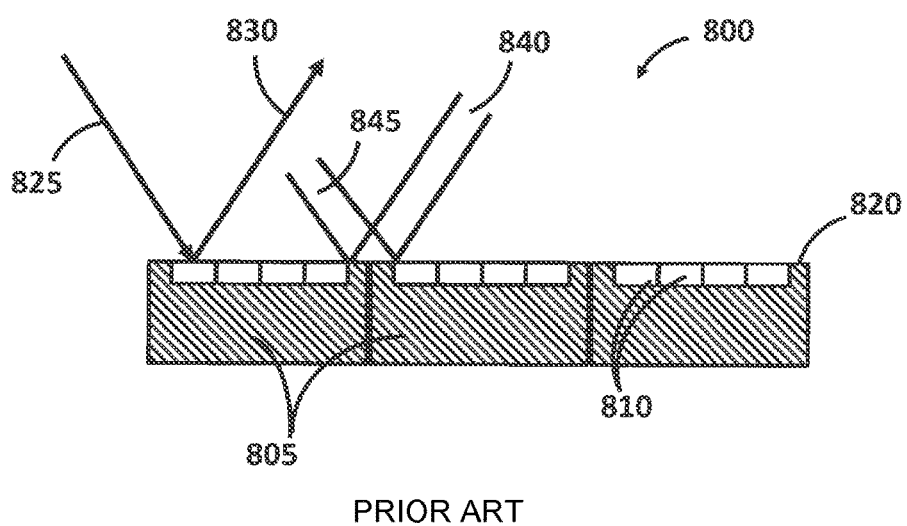
FIG. 8 shows a schematic illustration of a section through a facet mirror corresponding to the prior art.

FIG. 8 shows a facet mirror 800 as known from WO 12130768 A2, for example. The mirror modules 805 include individual mirrors 810. A non-reflective edge region 820 is situated at the edge of the mirror modules 805. If light 825 is incident on the facet mirror 800 obliquely, then shading regions 840, 845 arise. For adjacent mirror modules 805 arranged in one and the same plane, in each case both mutually adjoining non-reflective regions 820 of adjacent mirror modules 805 contribute to the shading regions with regard to the incident—upstream—845 and the reflected—downstream—840 light. This has two adverse effects. Firstly, light is lost from the point of view of the light source on account of the shading regions 845. Secondly, there are regions, from the point of view of the receiver, that is to say downstream regions, on the facet mirror 800 which remain unilluminated during operation on account of the shading regions 840.

Figure 9:
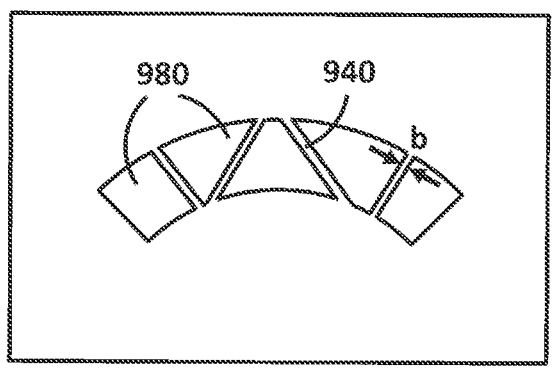
FIG. 9 shows a schematic illustration of the illumination of the reticle field using a facet mirror corresponding to the prior art.

FIG. 9 shows one of those adverse effects of these shading regions. In the case of an illumination system including a fly's eye condenser in which the field facets consist of individual mirrors 810, wherein a plurality of adjacent individual mirrors 810 form an illumination channel that completely illuminates the reticle field, the shading regions 840 shown downstream in FIG. 8 lead to shading regions 940 in the reticle field 980 if a non-reflective edge region 820 is present within the illumination channel. The intensity of the reticle field 980 is at least reduced at the shading regions 840. This has the disadvantageous effect that the uniformity of the illumination of the reticle field 980 is impaired. This disadvantage occurs only in the case of the fly's eye condenser, but not in the case of an illumination system 702 including a specular reflector 764, in which the reticle illumination is composed of many small, separate regions anyway.

In addition, the phase space behind the facet mirror 800 is greatly "perforated" by the shading regions 840 and no longer distinct in a continuous fashion. The envelope of the used phase space volume is thus larger than the used phase space volume, that is to say of the phase space volume by virtue of the intensity of the illumination light 670 not vanishing. Analogously, the phase space in front of the facet mirror 800 is greatly "perforated" by the shading regions 845 and thus not continuous. The effective reflectivity is reduced as a result. Likewise, unused regions are introduced in the phase space as a result, which has the effect that, for example, the minimum pupil filling is increased and thus impaired for many applications. The last two disadvantages mentioned occur both in the case of a fly's eye condenser and in the case of an illumination system including a specular reflector.

If the horizontal and vertical axes in FIG. 9 had the same scale, then the shading regions 940 of non-reflective module edge regions aligned orthogonally with respect to one another from FIG. 8 would be oriented at an angle of 90° with respect to one another in FIG. 9 as well.

Figure 1:
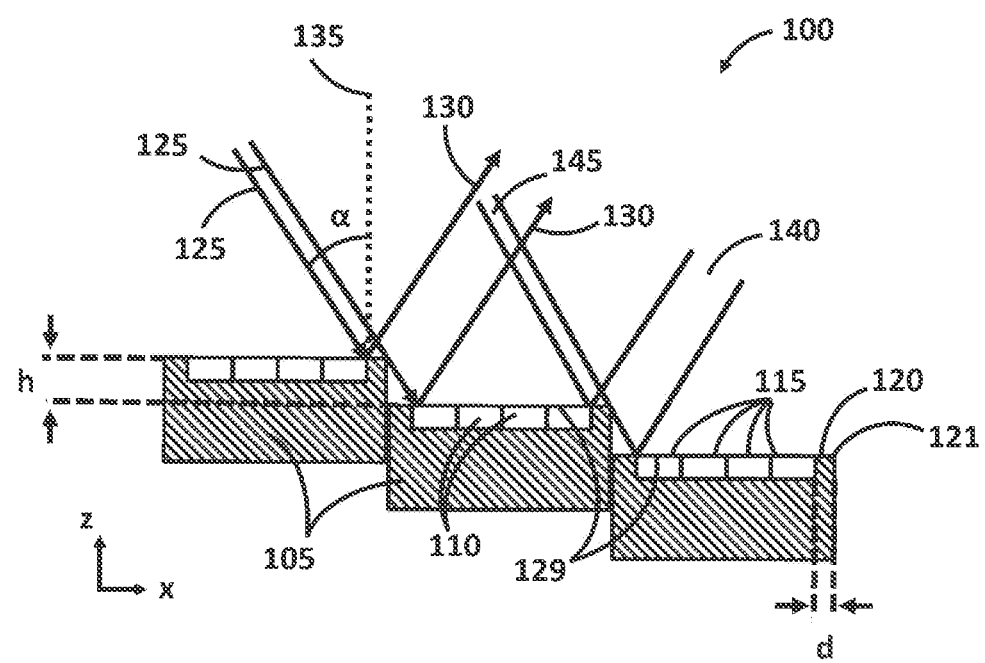
FIG. 1 shows a schematic illustration of a section through one embodiment of a facet mirror according to the disclosure.

FIG. 1 shows one embodiment of a facet mirror 100 according to the disclosure for use as an optical component in a projection exposure apparatus for EUV microlithography. The facet mirror 100 includes, merely by way of example, three mirror modules 105. The mirror modules 105 include individual mirrors 110, which are individually tiltable, and have mirror module surfaces 129. In this case, the mirror module surface 129 runs through the mid-points of all the individual mirrors 110 of the corresponding mirror module 105. This enables a description of the orientation of the mirror modules 105 which is independent of a possible tilting position of the adjustable individual mirrors. A non-reflective edge region 120 and a module edge 121 are situated at the edge of the mirror modules 105, wherein the module edge 121 should be understood as a one-dimensional edge of the non-reflective edge region 120.

In order to be able to spatially separate an incident ray 125 from a reflected ray 130 independently of a possible tilting position of the individual mirrors, the incident rays 125 do not impinge on the mirror module surface 129 perpendicularly. Therefore, the incident rays 125 impinge on the facet mirror 100 at an angle $\alpha$ with respect to the surface normal 135. By contrast, the light reflection angle depends on the position of the individual mirror 110. Therefore, there is a minimum and a maximum light reflection angle. Mirror modules each having two edge regions having the width d are shown by way of example in the figure. It is also possible for four edge regions to be present, wherein the other two edge regions are situated at the module edges running parallel to the plane of the drawing. Adjacent individual mirrors 110 in the mirror modules 105 are at a distance from one another that is less than the width, in particular half the width, of the non-reflective edge region 120. In this case, the distance between the individual mirrors 110 is the width of the non-reflective region between adjacent individual mirrors 110. If light 125 is then incident on the facet mirror 100 at a light incidence angle $\alpha$ with respect to the surface normal 135 of the mirror module surfaces 129, then the shading regions 140, 145 arise. Since the mirror module surfaces 129 of adjacent mirror modules 105 are not arranged in one and the same plane, both non-reflective regions 120 of adjacent mirror modules 105 do not contribute, at least do not contribute completely, to the shading regions with regard to the incident—upstream—145 and the reflected—downstream—140 light. Such shadings can have two adverse effects. Firstly, light is lost from the point of view of the light source on account of the shading regions 145, i.e. the effective reflectivity of the illumination system 602, 702 decreases. Secondly, there are regions, from the point of view of the receiver, that is to say downstream regions, on the facet mirror 100 which remain unilluminated during operation on account of the shading regions 140.

FIG. 1 shows one embodiment of the facet mirror 100 according to the disclosure, in which the shading regions 145 for the incident light 125 are greatly reduced. This reduction is achieved by virtue of the fact that the shadow arising on the adjacent module 105 as a result of the incident light 125 impinges at least partly on the non-reflective edge region 120 of an adjacent mirror module. In the case of the coordinate system illustrated in FIG. 1, the z-axis lies parallel to the surface normal 135 and the x-axis lies along a module edge lying parallel to the plane of the drawing. In the right-handed coordinate system, the y-axis thus points into the plane of the drawing. The light 125 is incident in FIG. 1 in such a way that the light direction can be decomposed vectorially into a component having a positive x-direction and into a component having a negative z-direction. The positive z-direction in each case faces away from the mirror module surface. The mirror modules are then arranged precisely such that a mirror module 105 adjoining in the positive x-direction is arranged in a manner offset by a height h in the negative z-direction. The arrangement of the mirror modules 105 in FIG. 1 is staircase-like, wherein a staircase structure descending in the direction of the incident light 125 is present. Besides the desired reduction of the shading region 145—upstream—, which leads to an advantageous reduction of the loss of light or an effective increase in the reflectivity, an enlargement of the shading region 140—downstream—arises, which leads to an increased loss of phase space volume. In the case of the embodiment illustrated in FIG. 1, a minimization of the shading region 145 results if the condition $h=d/\tan(\alpha)$ is fulfilled. In this case, d is given by the width of the edge region 120 which lies in the shadow region 145 of the incident light. If the height is increased, then reflection surfaces 115 of some individual mirrors 110 arranged at the edge of the adjacent, partly shaded mirror module 105 are included at least partly in the shadow region, which has the effect that they are no longer completely illuminated and thus no longer completely contribute to the reticle illumination. If the height $h<d/\tan(\alpha)$ is chosen, then the shading region 145 is enlarged in comparison with the theoretically optimum solution. Therefore, according to the disclosure it is particularly advantageous if the height h lies in the interval $0.5*d/\tan(\alpha)<h<1.5*d/\tan(\alpha)$.

If the condition $h>1.5*d/\tan(\alpha)$ holds true for the height, then it may be helpful for the mirror modules 105 to be offset laterally with respect to one another in such a way that the distance between them is increased, that is to say that mirror modules 105 adjoining in the positive x-direction are to be arranged in an offset manner in the positive x-direction. This reduces the proportion of the reflection surfaces 115 which at least partly lie in the shadow region.

In a further exemplary embodiment, the mirror modules 105 are arranged both in a manner offset laterally—in the x-direction—with respect to one another and in a height-offset manner—in the z-direction—with respect to one another.

In one exemplary embodiment, the mirror module 105 consists of 100×100 individual mirrors 110. The individual mirrors 110 have a size of 0.4 mm×0.4 mm. The non-reflective edge region 120 present on both sides has a width d of 0.1 mm. Given a light incidence angle $\alpha$ of 10°, a height offset h of approximately 0.567 mm results. Given a light incidence angle of 70°, a height offset h of approximately 0.036 mm results.

Further exemplary embodiments for different light incidence angles $\alpha$ [°] (by way of example for 80°, 70°, 20°, 10° and 5°) and different widths d [mm] (by way of example for 0.01 mm, 0.05 mm, 0.1 mm, 1 mm, 2 mm, 5 mm and 5 mm) and the height offset h [mm] that results in each case in accordance with the formula $h=d/\tan(\alpha)$ are presented in the following table.

| d [mm] | α [°] | | | | |
|---|---|---|---|---|---|
| | 80 | 70 | 20 | 10 | 5 |
| 0.01 | | 0.004 | 0.027 | 0.057 | 0.114 |
| 0.05 | 0.009 | 0.018 | 0.137 | 0.284 | 0.572 |
| 0.1 | 0.018 | 0.036 | 0.275 | 0.567 | 1.143 |
| 1 | 0.176 | 0.364 | 2.747 | 5.671 | 11.430 |
| 2 | 0.353 | 0.728 | 5.495 | 11.343 | 22.860 |
| 5 | 0.882 | 1.820 | 13.737 | 28.356 | 57.150 |
| 50 | 8.816 | 18.199 | 137.374 | | |

A facet mirror 100 for use as an optical component in a projection exposure apparatus for EUV microlithography is thus shown, wherein the facet mirror 100 includes at least two mirror modules 105, wherein the mirror modules 105 include individual mirrors 110, wherein the mirror modules 105 have mirror module surfaces 129, wherein the mirror modules 105 have at least on one side a non-reflective edge region 120 and a module edge 121, wherein adjacent individual mirrors 110 in the mirror modules 105 are at a distance from one another that is less than half the width of the non-reflective edge region 120, wherein the at least two adjacent module edges 121 of adjacent mirror modules 105 are arranged in a manner offset with respect to one another by a height along the surface normal 135 of one of the two mirror module surfaces 129.

A facet mirror 100 is thus likewise shown in which the mirror module surfaces 129 of the mirror modules 105 are oriented parallel to one another.

Figure 2:
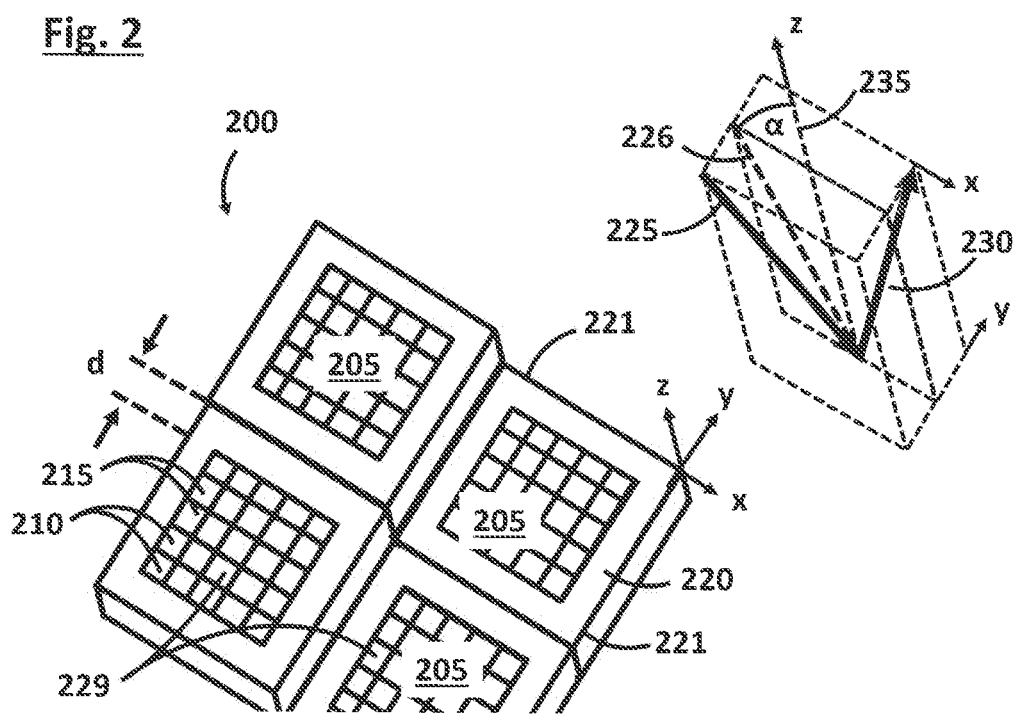
FIG. 2 shows a schematic, three-dimensional illustration of a facet mirror according to the disclosure.

FIG. 2 shows a three-dimensional illustration of the facet mirror 200 according to the disclosure. In contrast to the geometry discussed and shown in FIG. 1, the light 225 is not incident within a plane spanned by the surface normal 235 and a module edge 221. The module edge 221 should again be understood as a one-dimensional edge of the non-reflective edge region 220. Instead, the light is now incident in a "skew" fashion, that is to say not within one of the planes spanned by the (x,y,z)-coordinate system depicted, such as the (x,z)- or (y,z)-plane. In this case, the x-axis lies parallel to a first module edge 221, the y-axis lies parallel to a second module edge 221 aligned orthogonally with respect to the first module edge 221, and the z-axis lies parallel to the surface normal 235 of the mirror module surface 229. This coordinate system is the local coordinate system of the facet mirror 200. The light 225 incident in a "skew" fashion can then be decomposed vectorially into a "projected" component 226, which is projected into a plane spanned by the surface normal 235 and the module edge 221 oriented parallel to the x-axis. In order to minimize the shading region—upstream—, the height h by which two adjacent modules are offset relative to one another in the z-direction is chosen in such a way that the condition h=d/tan(α) initially mentioned is fulfilled, wherein α is the angle between the surface normal 235 and the projected component of the incident light 226. The arrangement of the mirror modules 205 in FIG. 2 is staircase-like, wherein a staircase structure descending in the direction of the incident light 225 is present.

Therefore, a facet mirror 200 according to the disclosure is shown which has an edge region having the width d at least on one side, wherein the at least two adjacent module edges 221 of the adjacent mirror modules 220 are arranged in a manner offset with respect to one another by a height h along the surface normal 235 of the first mirror module surface 229, wherein, during operation, light 225 is incident on the facet mirror 200 at the light incidence angle α, wherein it holds true that: 0.5*d/tan(α)<h<1.5*d/tan(α), wherein the light incidence angle α is the angle between the surface normal 235 of the first mirror module surface 229 and a component 226 of the incident light 225 projected into a plane that is perpendicular to the adjacent module edges 221 arranged in a height-offset manner with respect to one another.

Such an embodiment with light 225 incident in a "skew" fashion with respect to the module edges 221 can be advantageous since in this case the imagings of the shading regions 140, 840—downstream—from FIG. 1 into the reticle field 980 are not oriented parallel to the scanning direction of the reticle field 980. Such shadings 140, 840 lying parallel to the scanning direction—downstream—would be critical for the uniformity of the illuminated reticle field 980. Therefore, in the design, the mirror modules, as illustrated in FIG. 2, are to be arranged in a manner rotated relative to the incident light 225, such that the plane of incidence of the light 225 does not lie parallel to one of the module edges 221. Such micromirror arrays incorporated in a rotated fashion are described in DE102012207866.5.

Such an embodiment with light 225 incident in a "skew" fashion with respect to the module edges 221 can in particular also occur if the incident light 225 impinges at different locations on the facet mirror 200 in a manner not parallel to one another. This can occur in particular if the facet mirror 200 is illuminated via an intermediate focus 612, 712.

In a further embodiment, the module edges 221 are not orthogonal with respect to one another and, therefore, the mirror modules 205 are not square, as illustrated in FIG. 2, or rectangular, but rather rhomboidal.

Figure 3:
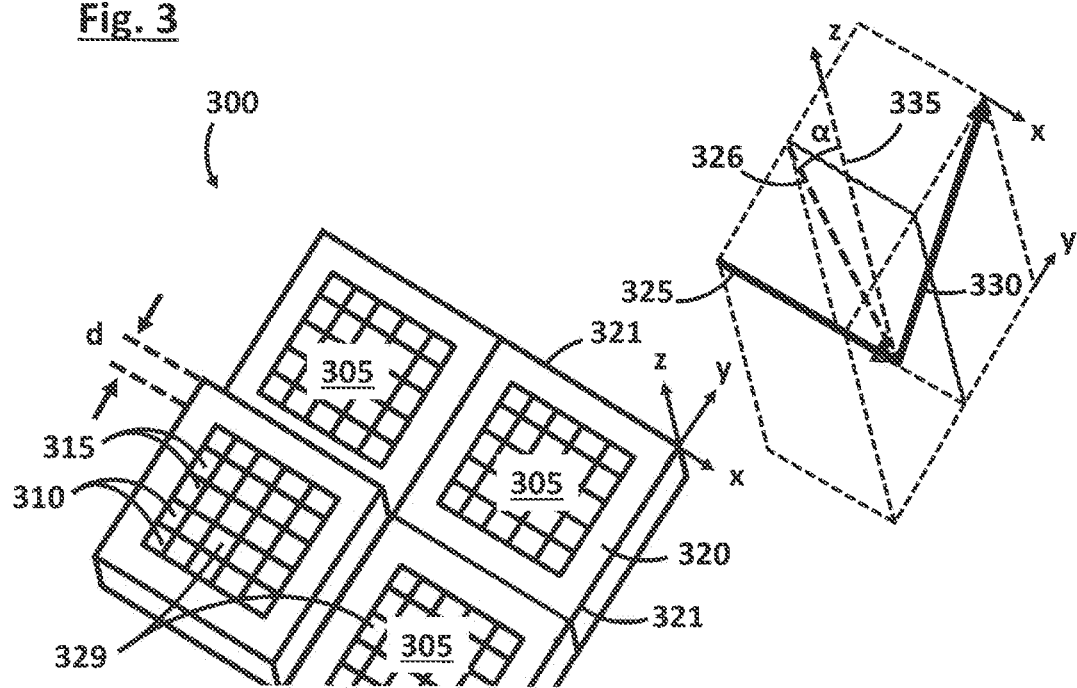
FIG. 3 shows a schematic, three-dimensional illustration of a facet mirror according to the disclosure.

FIG. 3 shows a three-dimensional illustration of the facet mirror 300 according to the disclosure. The difference with respect to FIG. 2 is that in FIG. 3 the projected component 326 is smaller than the projected component 226 in FIG. 2, i.e. the light 325 is incident in a "more skew" fashion or even in a "maximally skew" fashion. Here, "maximally skew" denotes the case where the projection of the incident light onto the x-axis has the same absolute value as the projection onto the y-axis. This has the effect that, in contrast to FIG. 2, the height offset h does not just concern modules adjacent along one direction—see "staircase" in FIG. 2 only in the x-direction—, rather additional steppings along the y-direction can be advantageous—see "staircase" in FIG. 3 in the x-y-direction. The arrangement of the mirror modules 305 in FIG. 3 is staircase-like, wherein a staircase structure descending in the direction of the incident light 325 and thus along the diagonals of the mirror modules 305 is present. Such a staircase structure is known as a pyramid staircase. This results in the minimization of the shading regions 145, 845—upstream—for the non-reflective edge regions along the module edges 321 which are aligned along x and also along y. In this embodiment, too, the advantageous height h according to the disclosure is determined via the formula 0.5*d/tan(α)<h<1.5*d/tan(α), wherein the light incidence angle α is the angle between the surface normal 335 of the first mirror module surfaces 329 and a component 326 of the incident light 325 projected into a plane that is perpendicular to the adjacent module edges 321 arranged in a height-offset fashion with respect to one another.

In an analogous form, a staircase structure ascending along the diagonals of the mirror modules can also be used in order to minimize the downstream shading regions.

A facet mirror 300 is thus shown in which the mirror modules 305 are arranged in an ascending manner, i.e. in the positive z-direction, or in a descending manner, i.e. in the negative z-direction, in the direction of the diagonals of the mirror modules 305.

Figure 4:
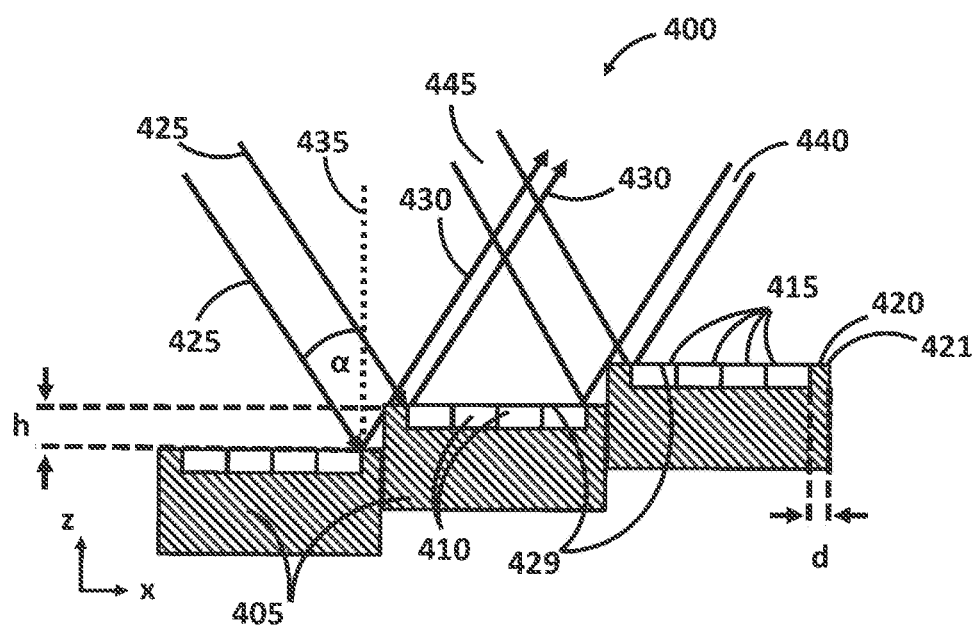
FIG. 4 shows a schematic illustration of a section through a further embodiment of a facet mirror according to the disclosure.

FIG. 4 shows a facet mirror 400 embodied in such a way that the shading region 440—downstream—is minimized. In FIG. 4, the light 425 is incident in such a way that the light direction can be decomposed vectorially into a component having a positive x-direction and into a component having a negative z-direction. The mirror modules are then arranged precisely such that a mirror module 405 adjoining in the positive x-direction is arranged in a manner offset by a height h in the positive z-direction. The arrangement of the mirror modules 405 in FIG. 4 is staircase-like, wherein a staircase structure ascending in the direction of the incident light 425 is present. In this case, d is given by the width of the edge region 420 which lies in the shadow region 400 of the reflected light 430. Besides the desired reduction of the shading region 440—downstream—an enlargement of the shading region 445—upstream—results. In the case of the embodiment illustrated in FIG. 4, a minimization of the shading region 440 results if the condition $h=d/\tan(\alpha)$ is fulfilled.

Such a reduction of the shading regions 440 has the advantageous effect that the uniformity of the illumination of the reticle field is improved. In addition, the phase space behind the facet mirror 400 is "perforated" to a lesser extent by the shading regions 440, that is to say the loss of phase space behind the facet mirror 400 is minimal. This has the effect that, for example, the pupil filling is optimized, which in turn improves the adjustability of illumination settings.

In the case of the exemplary embodiments in FIG. 1 and FIG. 4, the ratio of the widths of the upstream 140, 440 shading region, i.e. the shading region relevant to the incident light 125, 425, and of the downstream 140, 440 shading region, i.e. the shading region relevant to the reflected light 130, 430, is 1:3 in the case of FIG. 1 and 3:1 in the case of FIG. 4. In various advantageous embodiments, these ratios can vary in accordance with the condition $0.5*d/\tan(\alpha) < h < 1.5*d/\tan(\alpha)$, for example in the ranges 1:10 to 1:2 or 2:1 to 10:1.

A facet mirror 100, 400 is thus shown in which the ratio of the widths of the upstream 140, 440 shading region, i.e. the shading region relevant to the incident light 125, 425, and of the downstream 140, 440 shading region, i.e. the shading region relevant to the reflected light 130, 430, is between 1:10 and 1:2 or between 2:1 and 10:1. This width of the shading region can correspond for example to the width of the shading region in the x-direction in FIG. 1, or else be the width of the shading region perpendicular to the light propagation direction 125 and 130, respectively.

A facet mirror 100, 400 is thus shown in which, during operation, the edge region 120, 420 of a mirror module 105, 405 is situated in the shading region 140, 440 of the light incident 125, 425 on the facet mirror 100, 400 or reflected 130, 430 thereon.

Figure 5:
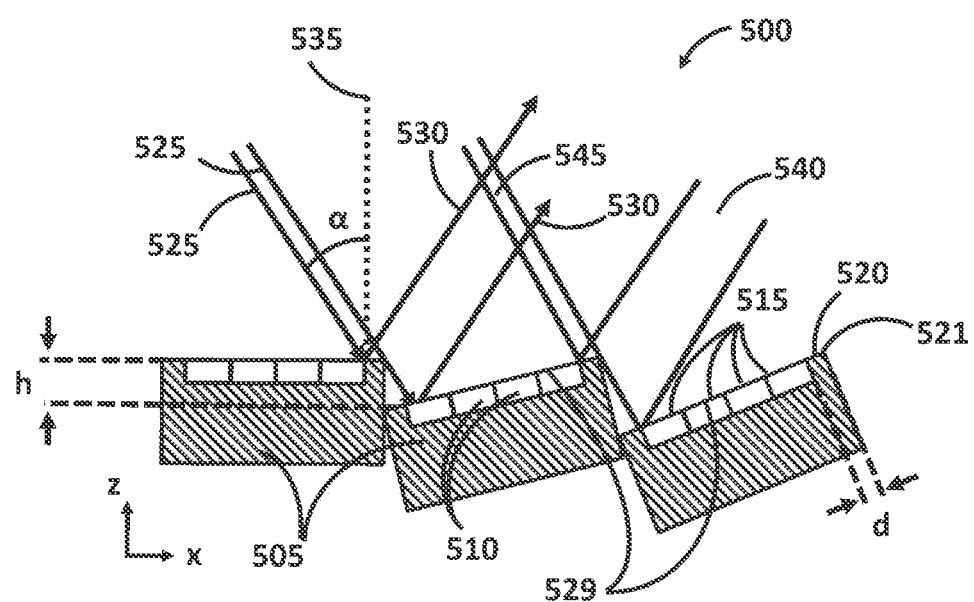
FIG. 5 shows a schematic illustration of a section through a further embodiment of a facet mirror according to the disclosure.

However, the disclosure is not restricted to a facet mirror 100, 200, 300, 400 in which the mirror module surfaces 129, 229, 329, 429 of the mirror modules 105, 205, 305, 405 are oriented parallel to one another. FIG. 5 shows a facet mirror 500 in which the mirror module surfaces 529 are tilted relative to one another. In this regard, in FIG. 5, the mirror modules 505 are rotated relative to one another about a normal to the plane of the drawing. In the case of such an arrangement, too, it is possible to apply the principle according to the disclosure of minimizing the shading regions of the incident light 545 or reflected light 540. If a first and an adjacent second mirror module 505 are considered, then the height offset h along the surface normal 535 of the first mirror module 505 between the adjacent module edges 520 of the two mirror modules 505 is considered in this case. The mirror modules 505 of the facet mirrors 500 can for example also be arranged in such a way that either the module mid-points lie on a curved surface, in particular on a convexly or on a concavely curved surface or on a spherical surface or on an ellipsoidal surface, or else the mirror module surfaces 529 of the mirror modules 505 approximately form a spherical surface or an ellipsoidal surface.

A facet mirror 500 is thus shown in which the mirror modules 505 are arranged on a spherical surface or an ellipsoidal surface.

The above-described embodiments of a facet mirror 100, 200, 300, 400, 500 according to the disclosure can preferably be used in the projection exposure apparatuses described below.

Figure 6:
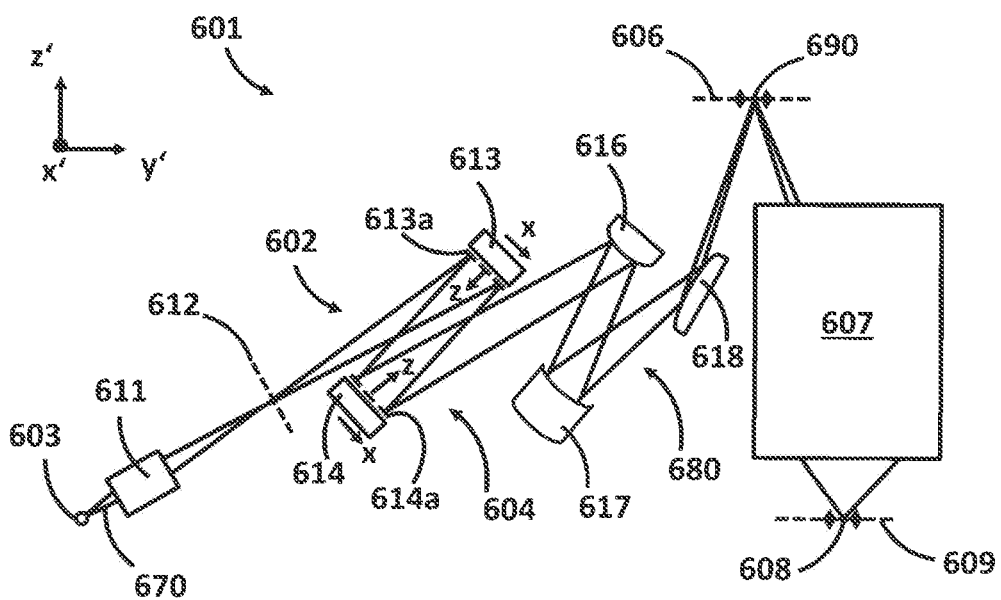
FIG. 6 shows a schematic illustration of a section through a projection exposure apparatus.

FIG. 6 shows a schematic section of a microlithographic projection exposure apparatus 601 as known from WO 2012/130768 A2. The projection exposure apparatus 601 includes a radiation source 603 and an illumination system 602 for the exposure of an object field 690. The illumination system 602 includes a so-called fly's eye condenser consisting of field facets 613a and pupil facets 614a. A reflective reticle (not illustrated in FIG. 6) arranged in the object plane 606 is exposed in this case, the reticle bearing a structure to be projected via the projection exposure apparatus 601 in order to produce micro- or nanostructured semiconductor components. The projection optical unit 607 serves for imaging the object field 690 into an image field 608 in an image plane 609. The structure on the reticle is imaged into a light-sensitive layer of a wafer (not illustrated in the drawing) arranged in the region of the image field 608 in the image plane 609. The reticle and the wafer are scanned in the y'-direction during the operation of the projection exposure apparatus 601. With the aid of the projection exposure apparatus 601, at least one part of the reticle is imaged onto a region of a light-sensitive layer on the wafer for lithographically producing a micro- or nanostructured component, in particular a semiconductor component, for example a microchip. Depending on the embodiment of the projection exposure apparatus 601 as a scanner or as a stepper, the reticle and the wafer are moved in a temporally synchronized manner in the y'-direction continuously in scanner operation or step by step in stepper operation. The radiation source 603 is an EUV radiation source having an emitted used radiation in the range of between 5 nm and 30 nm. This can be a plasma source, for example a GDPP source—Gas Discharge Produced Plasma—or an LPP source—Laser Produced Plasma. Other EUV radiation sources, for example those based on a synchrotron or on a free electron laser—FEL—, are also possible. EUV radiation 670 emerging from the radiation source 603 is focused by a collector 611. Downstream of the collector 611, the EUV radiation 670 propagates through an intermediate focal plane 612 before it impinges on a field facet mirror 613 having a multiplicity of field facets 613a. The field facet mirror 613 is arranged in a plane of the illumination optical unit 604 which is optically conjugate with respect to the object plane 606. Downstream of the field facet mirror 613, the EUV radiation 670 is reflected from a pupil facet mirror 614 having a multiplicity of pupil facets 614a. The pupil facet mirror 614 lies either in the entrance pupil plane of the projection optical unit 607 or in an optically conjugate plane with respect thereto. The field facet mirror 613 and the pupil facet mirror 614 are constructed from a multiplicity of individual mirrors. In this case, the subdivision of the field facet mirror 613 into individual mirrors can be such that each of the field facets 613a which per se illuminate the entire object field 690 is represented by exactly one of the individual mirrors. Alternatively, it is possible to construct at least some or all of the field facets 613a via a plurality of such individual mirrors. The same correspondingly applies to the configuration of the pupil facets 614a of the pupil facet mirror 614 which are respectively assigned to the field facets 613a and which can be formed in each case by a single individual mirror or by a plurality of such individual mirrors. The EUV radiation 670 impinges on the two facet mirrors 613, 614 at a light incidence angle, measured normally with respect to the mirror surface running through the corresponding mid-points of the individual mirrors 613a and 614a, respectively, which angle can be less than or equal to 25°. Impingement with grazing incidence is also possible, wherein the light incidence angle can be greater than or equal to 70°. The pupil facet mirror 614 is arranged in a plane of the illumination optical unit 604 which represents a pupil plane of the projection optical unit 607 or is optically conjugate with respect to a pupil plane of the projection optical unit 607.

With the aid of the pupil facet mirror 614, the field facets of the field facet mirror 613 are imaged into the object field 690 in a manner being superimposed on one another. Optionally, an imaging optical assembly in the form of a transfer optical unit 680, as illustrated in FIG. 6, can be present. In this case, with the aid of the pupil facet mirror 614 and the imaging optical assembly in the form of a transfer optical unit 680 having mirrors 616, 617 and 618 designated in the order of the beam path for the EUV radiation 670, the field facets of the field facet mirror 613 are imaged into the object field 690 in a manner being superimposed on one another. The last mirror 618 of the transfer optical unit 680 is a grazing incidence mirror. The illumination light 670 is guided from the radiation source 603 toward the object field 690 via a plurality of illumination channels. Each of the illumination channels is assigned a field facet 613a of the field facet mirror 613 and a pupil facet 614a of the pupil facet mirror 614, the pupil facet being disposed downstream of the field facet. The individual mirrors 613a of the field facet mirror 613 and the individual mirrors 614a of the pupil facet mirror 614 can be tiltable by an actuator system, such that it is possible to achieve a change in the assignment of the pupil facets 614a to the field facets 613a and correspondingly a changed configuration of the illumination channels. The individual mirrors of the field facet mirror 613 can be tiltable by an actuator system, such that it is possible to achieve a changed configuration of the illumination channels in conjunction with constant assignment of the pupil facets 614a to the field facets 613a.

This results in different illumination settings that differ in the distribution of the illumination angles of the illumination light 670 over the object field 690.

A facet mirror 100, 200, 300, 400, 500 according to the disclosure can preferably be used in an above-described illumination system 602 including a fly's eye condenser, in particular as a field facet mirror 613 and/or pupil facet mirror 614.

A further advantageous embodiment includes an illumination system 602 including a fly's eye condenser, the field facet mirror 613 of which and the pupil facet mirror 614 of which include a facet mirror 100, 200, 300, 400, 500 according to the disclosure. In this case, the facet mirror 100, 200, 300, 500 according to the disclosure that is used as a field facet mirror 613 includes mirror modules 105, 205, 305, 505 arranged in a descending manner, i.e. in the negative z-direction, in the direction of the incident light 125, 225, 325, 525, wherein the z-direction relevant to the field facet mirror 613, as shown by the axes x and z depicted on the field facet mirror 613 in FIG. 6, is oriented parallel to the surface normal 135, 235, 335, 535 of the field facet mirror 613 and faces away from the mirror module surface 129, 229, 329, 529 thereof. Moreover, the facet mirror 100, 200, 300, 400, 500 according to the disclosure that is used as a pupil facet mirror 614 includes mirror modules 105, 205, 305, 405, 505 arranged in an ascending manner, that is to say in the positive z-direction, in the direction of the incident light 125, 225, 325, 425, 525, wherein the z-direction relevant to the pupil facet mirror 614, as shown by the axes x and z depicted on the pupil facet mirror 614 in FIG. 6, is oriented parallel to the surface normal 135, 235, 335, 435, 535 of the pupil facet mirror 614 and faces away from the mirror module surface 129, 229, 329, 429, 529 thereof.

As described thoroughly in the description of FIG. 1 and FIG. 4, such an embodiment reduces both the shading region 145, 445, 545 (see FIG. 1) of the light 125, 225, 325, 425, 525 incident on the field facet mirror 613—upstream—and the shading region 140, 440, 540 (see FIG. 4) of the light 130, 230, 330, 430, 530 reflected by the pupil facet mirror 614—downstream. This results in the advantages of both embodiments discussed above: low loss of light as a result of the "descending" embodiment of the field facet mirror 613 and lower loss of phase space behind the pupil facet mirror 614 as a result of "ascending" embodiment of the pupil facet mirror 614. In this case, the light incidence angles α at which the light is incident on the field facet mirror 613 and/or the pupil facet mirror 614 can be different and in the "normal incidence" range of 5°-30° or in the "grazing incidence" range of 70°-90°.

Figure 7:
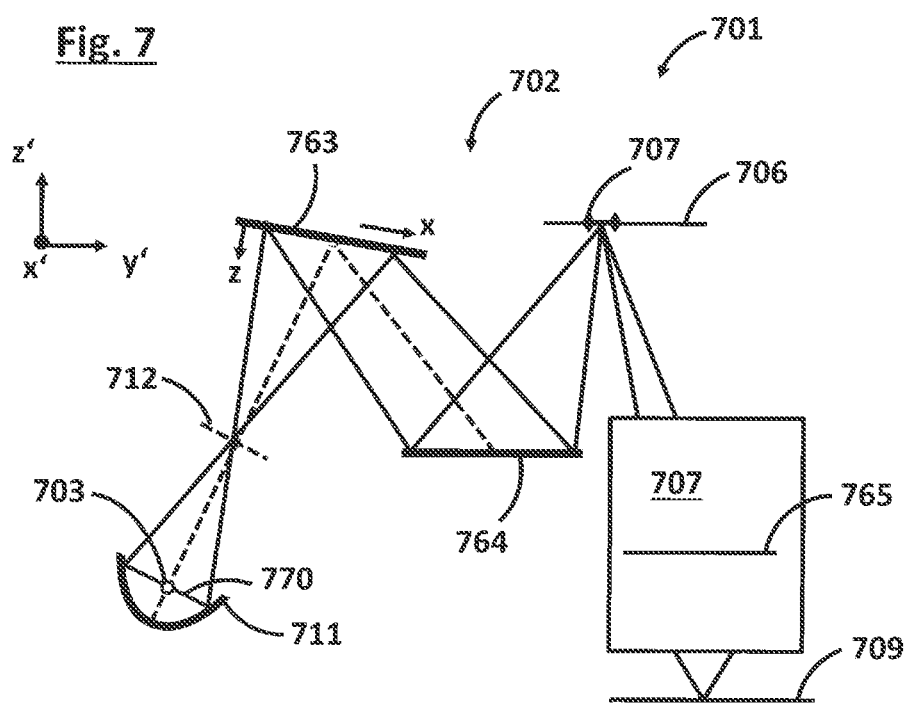
FIG. 7 shows a schematic illustration of a section through a projection exposure apparatus.

FIG. 7 shows a projection exposure apparatus 701 known from US 2011001947 AA, including an alternative illumination optical unit of an illumination system 702. EUV radiation 770 emerging from the radiation source 703 is focused by a collector 711. Downstream of the collector 711, the EUV radiation 770 propagates through an intermediate focal plane 712 before it impinges on a beam shaping facet mirror 763, which serves for the targeted illumination of a specular reflector 764. Via the beam shaping facet mirror 763 and the specular reflector 764, the EUV radiation 770 is shaped such that the EUV radiation 770 illuminates the object field 790 in the object plane 706, wherein a predefined, for example homogeneously illuminated, circularly bordered pupil illumination distribution, that is to say a corresponding illumination setting, results in a pupil plane 765 of the projection optical unit 707 disposed downstream of the reticle. The effect of the specular reflector 764 is described in detail in US 2006/0132747 A1. A reflection surface of the specular reflector 764 is subdivided into individual mirrors. Depending on the desired illumination properties, these individual mirrors of the specular reflector 764 are grouped into individual-mirror groups, that is to say facets of the specular reflector 764. Each individual-mirror group forms an illumination channel which in each case per se does not completely illuminate the reticle field. Only the sum of all the illumination channels leads to a complete and homogeneous illumination of the reticle field. Both the individual mirrors of the specular reflector 764 and the facets of the beam shaping facet mirror 763 can be tiltable by an actuator system, such that different field and pupil illuminations can be set.

A facet mirror 100, 200, 300, 400, 500 according to the disclosure can preferably be used in an above-described illumination system 702 including a specular reflector 764, in particular as a beam shaping mirror module 763.

In accordance with the embodiments in FIG. 1 and FIG. 4, according to the disclosure either the effective reflectivity can be optimized, which is more attractive in the case of an illumination system 702 including a specular reflector 764, or the loss of phase space behind the facet mirror 400 and the associated uniformity of the reticle field illumination 980 can be optimized, which may be more attractive for fly's eye condenser. The choice of the type of height offset, e.g. "ascending" or "descending" embodiment, and the choice of the height h in terms of absolute value, in the case of the fly's eye condenser, depend, however, on the specific design of the fly's eye condenser.

In the case of an illumination system 702 including a beam shaping facet mirror 763 and a specular reflector 764 it is particularly advantageous if the mirror modules 105 of the beam shaping facet mirror 763 are arranged in a descending manner, that is to say in the negative z-direction, in the direction of the incident light 125, as shown by the axes x and z depicted on the beam shaping facet mirror 763 in FIG. 7. The positive z-direction in each case faces away from the mirror module surface 129. As a result of such an arrangement, the upstream shading region 145 is reduced, which leads to an increase in the effective reflectivity.

The discussed (x', y', z')-coordinate systems of the projection exposure apparatuses 601 in FIG. 6 and 701 in FIG. 7 differ from the (x, y, z)-coordinate systems of the facet mirror 100, 200, 300, 400, 500, 800 and are not identical.

LIST OF REFERENCE SIGNS

100, 200, 300, 400, 500, 800 Facet mirror
105, 205, 305, 405, 505, 805 Mirror modules
110, 210, 310, 410, 510, 810 Individual mirrors
115, 215, 315, 415, 515 Reflection surface
120, 220, 320, 420, 520, 820 Edge region
121, 221, 321, 421, 521 Module edge
125, 225, 325, 425, 525, 825 Incident light
226, 326 Projected component of the incident light
129, 229, 329, 429, 529, Mirror module surface
130, 230, 330, 430, 530, 830 Reflected light
135, 235, 335, 435, 535 Surface normal
140, 440, 540, 840, 940 Shading region—downstream
145, 445, 545, 845 Shading region—upstream
601, 701 Projection exposure apparatus
602, 702 Illumination system
603, 703 Radiation source
604 Illumination optical unit
606, 706 Object plane
607, 707 Projection optical unit
608 Image field
609, 709 Image plane
611, 711 Collector
612, 712 Intermediate focal plane
613 Field facet mirror
613a Field facets
614 Pupil facet mirror
614a Pupil facets
616, 617, 618 Mirrors of the transfer optical unit
670, 770 EUV radiation
680 Transfer optical unit
690, 790 Object field
763 Beam shaping facet mirror
764 Specular reflector
765 Pupil plane
980 Reticle field

The invention claimed is:

1. A facet mirror, comprising:
at least three mirror modules arranged alongside each other in a staircase-like fashion,
wherein:
for each of the at least three mirror modules:
each mirror module comprises:
a multiplicity of individual mirrors;
a mirror module surface; and
at least on one side, a non-reflective edge region; and
adjacent individual mirrors in the mirror module are a distance from each other that is less than half a width of the non-reflective edge region;
at least two adjacent module edges of adjacent mirror modules are offset with respect to each other by a height h along a surface normal of one of the two mirror module surfaces;
the height h is less than 100 millimeters; and
wherein:
the edge region on at least one side has a width d;
the facet mirror is configured so that, during use of the facet mirror, light is incident on the facet mirror at an incidence angle $\alpha$;
the incidence angle $\alpha$ is an angle between the surface normal of the mirror module surface of one of the mirror modules and a component of the incident light;
the component is projected into a plane that is perpendicular to one of the adjacent module edges arranged in a height-offset manner with respect to one another;
$0° < \alpha < 90°$; and
$0.5 * d/\tan(\alpha) < h < 1.5 * d/\tan(\alpha)$.

2. The facet mirror of claim 1, wherein the height h is less than 10 millimeters.

3. The facet mirror of claim 1, wherein the height h is greater than 0.01 millimeter.

4. The facet mirror of claim 1, wherein the height h is greater than 0.1 millimeter.

5. The facet mirror of claim 1, wherein the facet mirror is configured so that, during use of the facet mirror, an edge region of a mirror module is in a shading region of light incident on the facet mirror.

6. The facet mirror of claim 1, wherein the facet mirror is configured so that, during use of the facet mirror when light is reflected from the facet mirror, a ratio of a width of an upstream shading region of light to a width of a downstream shading region of light is between 1:10 and 1:2.

7. The facet mirror of claim 1, wherein:
the at least three mirror modules are configured so that, during use of the facet mirror when light is incident on the facet mirror, the at least three mirrors are offset in a negative z-direction in a direction the incident light; and
the negative z-direction is parallel to one of the surface normals and faces away from the mirror module surface.

8. The facet mirror of claim 1, wherein the facet mirror is configured so that, during use of the facet mirror when light is reflected from the facet mirror, an edge region of a mirror module is in a shading region of light reflected from the facet mirror.

9. The facet mirror of claim 1, wherein the facet mirror is configured so that, during use of the facet mirror when light is reflected from the facet mirror, a ratio of a width of an upstream shading region of light to a width of a downstream shading region of light is between 1:10 and 1:2.

10. The facet mirror of claim 1, wherein:
the at least three mirror modules are configured so that, during use of the facet mirror when light is reflected by the facet mirror, the at least three mirror modules are offset in a positive z-direction in a direction of the light incident light on the facet mirror; and
the z-direction is parallel to one of the surface normals and faces away from the mirror module surface.

11. The facet mirror of claim 1, wherein the at least three mirror modules are arranged in a staircase-like fashion in a direction of diagonals of the mirror modules.

12. The facet mirror of claim 1, wherein:
the at least three mirror modules are arranged in an ascending manner in a positive z-direction in a direction of the diagonals of the at least three mirror modules; and
the z-direction is parallel to one of the surface normals and faces away from the mirror module surface.

13. The facet mirror of claim 1, wherein:
the at least three mirror modules are arranged in a descending manner in a positive z-direction in a direction of the diagonals of the at least three mirror modules; and
the z-direction is parallel to one of the surface normals and faces away from the mirror module surface.

14. The facet mirror of claim 1, wherein the mirror module surfaces of the at least three mirror modules are parallel to each other.

15. The facet mirror of claim 1, wherein the at least three mirror modules are on a curved surface.

16. The facet mirror of claim 1, wherein the individual mirrors are tiltable.

17. The facet mirror of claim 1, wherein the at least three mirror modules comprise two-dimensional individual-mirror arrays, and the individual mirrors have a size in a range of from 0.01 millimeter to 10 millimeters.

18. An illumination system, comprising:
a facet mirror according to claim 1.

19. The illumination system of claim 18, wherein the facet mirror is a field facet mirror.

20. The illumination system of claim 18, wherein the facet mirror is a pupil facet mirror.

21. An apparatus, comprising:
an illumination system comprising a facet mirror according to claim 1; and
a projection optical unit,
wherein the apparatus is a microlithography projection exposure apparatus.

22. An illumination system, comprising:
a specular reflector; and
a facet mirror according to claim 1,
wherein the facet mirror is configured to illuminate the specular reflector.

* * * * *

UNITED STATES PATENT AND TRADEMARK OFFICE
CERTIFICATE OF CORRECTION

PATENT NO.         : 9,823,577 B2
APPLICATION NO.    : 15/050889
DATED              : November 21, 2017
INVENTOR(S)        : Michael Patra and Markus Deguenther It is certified that error appears in the above-identified patent and that said Letters Patent is hereby corrected as shown below:

On the Title Page

Column 1, Line 1 of "Assignee:", delete "Oberkochenl" and insert -- Oberkochen --.

In the Specification

Column 15, Line 47, after "field", insert -- . --.

Signed and Sealed this
Sixth Day of March, 2018

Andrei Iancu
*Director of the United States Patent and Trademark Office*